(12) United States Patent
Kwon et al.

(10) Patent No.: US 12,364,066 B2
(45) Date of Patent: Jul. 15, 2025

(54) TRANSPARENT MICRO DISPLAY DEVICE

(71) Applicant: LG Display Co., Ltd., Seoul (KR)

(72) Inventors: KyuOh Kwon, Paju-si (KR); Junghun Choi, Paju-si (KR); Jaeyong Choi, Paju-si (KR); SeungJun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 575 days.

(21) Appl. No.: 17/224,745

(22) Filed: Apr. 7, 2021

(65) Prior Publication Data

US 2021/0320228 A1    Oct. 14, 2021

(30) Foreign Application Priority Data

Apr. 8, 2020    (KR) .................. 10-2020-0042635

(51) Int. Cl.
*H10H 20/832* (2025.01)
*G09G 3/32* (2016.01)
*H10H 20/831* (2025.01)
*H10H 20/857* (2025.01)
*H10H 29/14* (2025.01)

(52) U.S. Cl.
CPC ............ *H10H 20/835* (2025.01); *G09G 3/32* (2013.01); *H10H 20/8316* (2025.01); *H10H 20/857* (2025.01); *H10H 29/142* (2025.01)

(58) Field of Classification Search
CPC ..... H01L 33/387; H01L 27/156; H01L 33/48; H01L 33/486; H01L 28/87; H01L 28/91; H01L 28/40; H01L 33/62; H10K 59/126; G09G 3/32; G09G 3/3233; H10H 29/142; H10H 20/857; H10H 20/8316; H10H 20/835

See application file for complete search history.

(56) References Cited

U.S. PATENT DOCUMENTS

| | | | | |
|---|---|---|---|---|
| 5,977,565 | A | * | 11/1999 | Ishikawa .................. H01L 33/62 257/E27.12 |
| 2014/0175393 | A1 | * | 6/2014 | Beak .................. H10K 59/1216 257/40 |
| 2017/0263828 | A1 | * | 9/2017 | Mao ...................... H10K 59/121 |
| 2019/0157341 | A1 | * | 5/2019 | Chang .................... H01L 27/124 |
| 2022/0005994 | A1 | * | 1/2022 | Morita ..................... G09G 3/32 |

FOREIGN PATENT DOCUMENTS

| | | | |
|---|---|---|---|
| CN | 102427080 A | | 4/2012 |
| CN | 107331680 A | | 11/2017 |
| CN | 107610604 A | * | 1/2018 |
| KR | 10-2014-0083852 A | | 7/2014 |
| WO | WO 2019/235147 A1 | | 12/2019 |

OTHER PUBLICATIONS

CN-107610604-A English translation (Year: 2018).*

* cited by examiner

*Primary Examiner* — Latanya N Crawford Eason
(74) *Attorney, Agent, or Firm* — Birch, Stewart, Kolasch & Birch, LLP

(57) ABSTRACT

Discussed herein is a transparent light emitting diode (LED) display device. A capacitor of a pixel-driving circuit is integrated with an LED, and thus that the area of the pixel-driving circuit is reduced, and the transmission area is increased. In this manner, it is possible to achieve high transmittance without compromising the display quality.

15 Claims, 7 Drawing Sheets

TRANSPARENT MICRO DISPLAY DEVICE

CROSS-REFERENCE TO RELATED APPLICATIONS

This application claims priority to Korean Patent Application No. 10-2020-0042635 filed in the Korean Intellectual Property Office on Apr. 8, 2020, the entire contents of which are hereby expressly incorporated by reference in its entirety as if fully set forth herein into the present application.

BACKGROUND OF THE INVENTION

Technical Field

The present disclosure relates to a light emitting diode (LED) display device, and more particularly, to a transparent LED display device in which a capacitor and an LED are combined.

Description of the Related Art

In succession to liquid-crystal display devices (LCDs) which have been widely used up to now, organic light-emitting display devices (OLEDs) find more and more applications.

In the above-described display devices, a plurality of light-emitting elements is disposed on a substrate of a display device to display images, and a driving element for supplying a driving signal or a driving current is disposed on the substrate together with the light-emitting elements to control each of the light-emitting elements to emit light individually. The plurality of light-emitting elements disposed on the substrate is analyzed according to the arrangement of information to be displayed, to display it on the substrate.

A liquid-crystal display device is not a self-luminous device and thus requires a backlight unit on the rear side of the liquid crystal display to illuminate light. Such a backlight unit increases the thickness of the liquid-crystal display device. In addition, it is not easy to implement a display device having a variety of shapes, like a flexible or circular display device with such a backlight unit. Moreover, the luminance and response speed can deteriorate.

On the other hand, a display device having a self-luminous element can be made thinner than a display device having a light source, allowing for a flexible and foldable display device. A display device with a self-luminous element can include an organic light-emitting display device including an organic material as an active layer. Such an organic light-emitting display device is self-luminous and thus requires no additional light source, and accordingly can be utilized as thinner or various shapes of display devices.

Unfortunately, an organic light-emitting display device using an organic material is vulnerable to permeation of moisture and oxy, and thus there can be an issue that a defective pixel may occur due to the oxidation phenomenon between an organic active layer and an electrode. Accordingly, a variety of elements can be additionally needed to suppress permeation of oxygen and moisture.

In view of the above, in order to address such issues of a liquid-crystal display device and/or an organic light-emitting display device according to a related art, an LED display device using light-emitting diodes (LEDs) as light-emitting elements has been recently proposed.

In such an LED display device, a mini- or micro-sized ultra-small LED using an inorganic material as a light-emitting element is disposed in a sub-pixel. By using an inorganic material as a light-emitting element, it is possible to implement a display device that realizes high-definition images, has high reliability against defects such as moisture permeation, and has a long lifetime.

In particular, research on a transparent display device using such an LED display device is recently ongoing actively. A transparent LED display device allows a viewer to see objects or images located behind the display device through it. Accordingly, a transparent LED display device has advantages in terms of convenience, space utilization and design and can have a variety of application fields.

SUMMARY OF THE INVENTION

An object of the present disclosure is to provide a transparent display using micro LEDs as light-emitting elements.

An LED display device according to an exemplary embodiment of the present disclosure can be configured by disposing a pixel-driving circuit and a capacitor-integrated LED on a substrate including a transmission area and a display area.

The capacitor-integrated LED device can include a first capacitor electrode, a capacitor dielectric layer, a second capacitor electrode, a p-type layer, an active layer, an n-type layer, and an n-type electrode disposed above the second capacitor electrode. The p-type layer, the active layer, the n-type layer and the n-type electrode can be sequentially stacked on the second capacitor electrode.

The n-type layer can be disposed on the second capacitor electrode, the n-type electrode and the active layer can be located on the same layer above the n-type layer, and the p-type layer and the p-type electrode can be sequentially stacked on the active layer.

Among these, the first capacitor electrode, the second capacitor electrode and the capacitor dielectric layer can form the capacitor, and the capacitor electrodes can be formed as reflective electrodes that include at least one of gold (Au), aluminum (AL), silver (Ag), nickel (Ni) and chromium (Cr) materials.

The second capacitor electrode can function as a p-type electrode connected to the p-type layer to apply a voltage and also as one electrode of the capacitor.

A first voltage line Vcom connected to the n-type electrode can be further included.

In addition, the pixel-driving circuit connected to the capacitor-integrated LED can include a switching thin-film transistor, a driving thin-film transistor and a sensing thin-film transistor.

The switching thin-film transistor can include a gate electrode connected to a first gate line; a source electrode connected to the data voltage line Vdata; and a drain electrode connected to a gate electrode of the driving thin-film transistor and the first capacitor electrode.

The driving thin-film transistor can include a gate electrode connected to a drain electrode of the switching thin-film transistor; a drain electrode connected to the second voltage line Vdd; and a source electrode connected to the second capacitor electrode.

The sensing thin-film transistor can include a gate electrode connected to a second gate line; a drain electrode connected to the sensing voltage line Vref; and a source electrode connected to the source electrode of the driving thin-film transistor.

The first capacitor electrode and the second capacitor electrode can be electrically connected to the drain electrode of the switching thin-film transistor and the source electrode of the driving thin-film transistor through conductors, respectively, and the conductors can include bump balls composed of an inner polymer core and an outer metal layer.

In addition, the pixel-driving circuit can include a switching thin-film transistor and a driving thin-film transistor, and the switching thin-film transistor can include a gate electrode connected to a first gate line; a drain electrode connected to the data voltage line Vdata; and a source electrode connected to the gate electrode of the driving thin-film transistor and the first capacitor electrode.

The driving thin-film transistor can include a gate electrode connected to a source electrode of the switching thin-film transistor; a source electrode connected to the second voltage line Vdd and the second capacitor electrode; and a drain electrode connected to the p-type electrode.

The LED display device can include an insulating layer to form and specific elements and connect between them. Specifically, it can include a first insulating layer between the switching thin-film transistor and the driving thin-film transistor; a second insulating layer between the pixel-driving circuit and the capacitor-integrated LED; and a third insulating layer between the capacitor-integrated LED and an adjacent capacitor-integrated LED.

The LED display device can further include: a black matrix between the capacitor-integrated LED and the adjacent capacitor-integrated LED.

The capacitor-integrated LED can be applied to a micro LED or a mini LED.

The details of one or more embodiments of the subject matter described in this specification are set forth in the accompanying drawings and the description below.

According to an exemplary embodiment of the present disclosure, capacitor electrodes are integrated into an LED, so that the area of a pixel-driving circuit is reduced while a transmission area is increased. As the transmission area is increased in this manner, the transmittance can be improved without compromising the display quality.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION OF THE EMBODIMENTS

Figure 1:
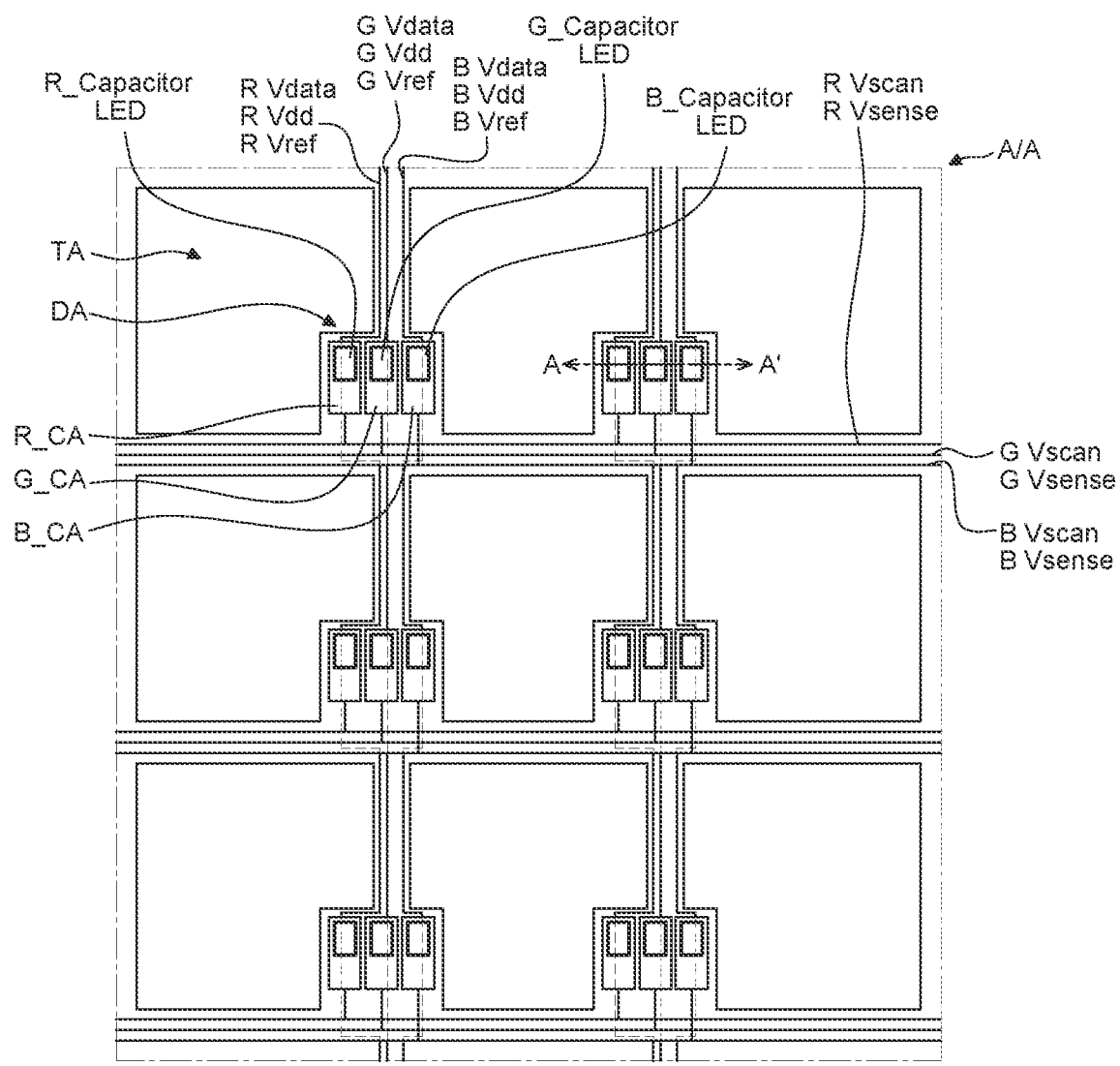
FIG. 1 is a plan view showing an LED display device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but can be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, when it is determined that the detailed description of the known art related to the present disclosure can obscure the gist of the present invention, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C can be disposed between the elements A and B unless the term "directly" or "immediately" is explicitly used.

As used herein, a phrase "an element A on an element B" refers to that the element A can be disposed directly on the element B and/or the element A can be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element can be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure can be combined partially or totally. As will be clearly appreciated by those skilled in the art, technically various interactions and operations are possible. Various exemplary embodiments can be practiced individually or in combination.

The display device according to the exemplary embodiments of the present disclosure can be applied to, but is not limited to, an LED display device. It can be applied to a variety of display devices.

Hereinafter, an LED display device according to exemplary embodiments of the present disclosure will be described with reference to the accompanying drawings. All the components of the LED display device according to all embodiments of the present disclosure are operatively coupled and configured.

Particularly, FIG. 1 is a plan view showing an LED display device according to an exemplary embodiment of the present disclosure.

Referring to FIG. 1, a substrate 100 of the LED display device according to the exemplary embodiment of the present disclosure includes a transmission area TA and a display area DA. The transmission area TA is an area of an active area A/A in which an image is displayed, excluding the display area DA and the signal lines, and is located around the display area DA. Light transmits the transmission area TA, and objects or images located behind the LED display device can be viewed, thereby implementing a transparent display device.

The display area DA is an area of the active area A/A of the display device in which pixel-driving circuits CA (e.g., R_CA for driving red pixels, G_CA for driving green pixels, B_CA for driving blue pixels) and the light-emitting elements including the LEDs are located, and can be spaced apart from another display area at a predetermined distance within the active area A/A. Signal lines connected to the pixel-driving circuits CA can be further disposed in the display area DA. In addition, since light-emitting elements including LEDs are located in the display area DA, an image a user wants to display can be displayed. To achieve colorful images, a single pixel can consist of or include a red (R) SUB-pixel, a green (G) SUB-pixel, and a blue (B) SUB-pixel, and each of the red (R), green (G) and blue (B) SUB-pixels includes a single light-emitting element.

Figure 2:
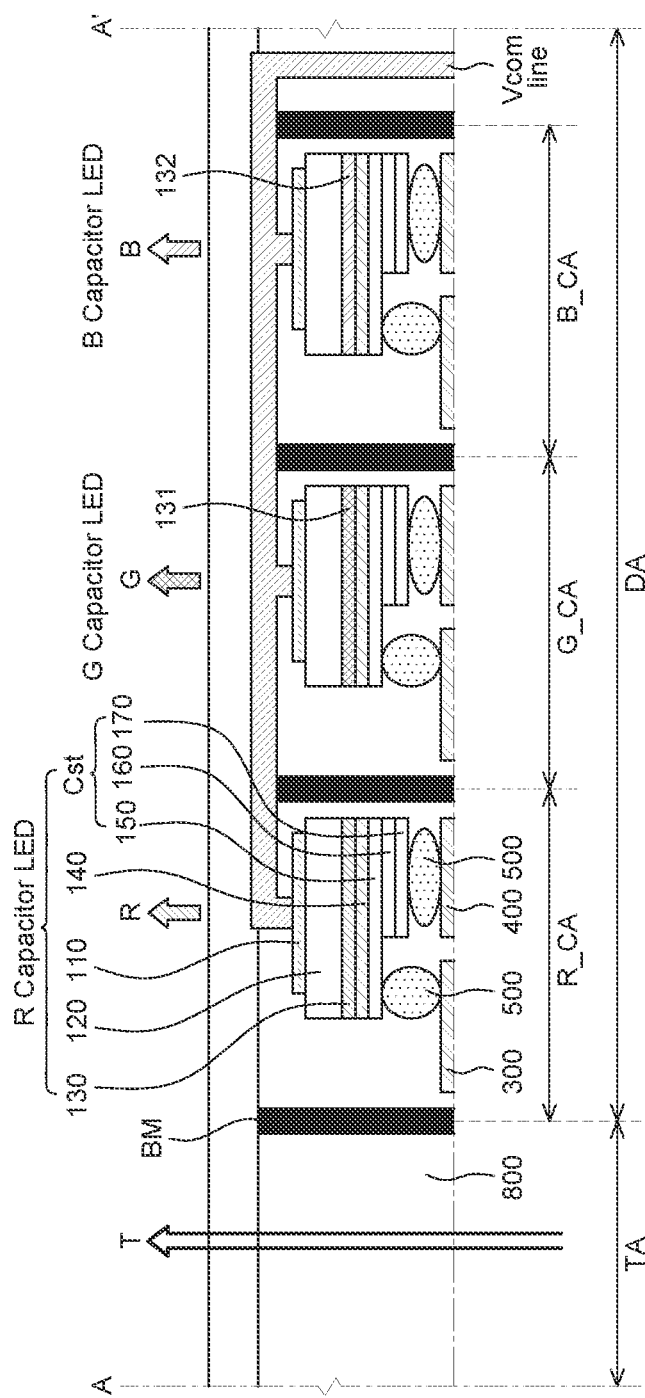
FIG. 2 is a cross-sectional view showing the configuration of a capacitor-integrated LED according to the first exemplary embodiment, taken along line A-A' of the display device shown in FIG. 1.

FIG. 2 is a cross-sectional view showing the transmission area TA and the display area DA according to an exemplary embodiment of the present disclosure, and specifically is a cross-sectional view taken along line A-A' of FIG. 1.

Referring to FIGS. 1 and 2, an insulating layer 800 and an optical film are disposed in the transmission area TA of the display device according to the exemplary embodiment of the present disclosure, and pixel-driving circuits and light-emitting elements are disposed in the display area DA as well as the insulating layer and the optical film. Since the light-emitting elements and the pixel-driving circuits are not disposed in the transmission area TA, the aperture ratio and transmittance are higher in the transmission area TA than in the display area DA. Herein, the aperture ratio refers to ratio of the transmission area to the total area of the display device, and the transmittance refers to the ratio of transmitted light to the supplied light.

According to the exemplary embodiment of the present disclosure, LEDs are employed as the light-emitting elements in order to further increase transmittance and aperture ratio.

As can be seen from Table 1 below, the LED display device according to the exemplary embodiment of the present disclosure employing LEDs as the light-emitting elements exhibits better luminance, aperture ratio, transmittance and reliability than OLED display devices of the related art.

TABLE 1

| | Example of OLED display device (transparent) | Example of LED display device of Present Invention (transparent) |
|---|---|---|
| Luminance | 150 nit | 300 nit↑ (improved by 100%↑) |
| Aperture ratio | 47% | 63% (improved by 34%) |
| Transmittance | 40% (optical film and color filter are employed, and cathode electrode is stacked on the entire substrate. Approximately 85% relative to aperture ratio) | 60% (improved by 50%) (Optical film is employed. Approximately 95% relative to aperture ratio) |
| Reliability | Low (organic material is employed) | High (inorganic material is employed) |

In terms of luminance and reliability, the LED display device according to the present disclosure uses an inorganic material as the light-emitting elements, and thus has higher luminance and reliability (lifetime) than an OLED display device using an organic material.

In terms of aperture ratio, according to the exemplary embodiment of the present disclosure, a capacitor Cst located in the pixel-driving circuit is integrated into the LED, thereby reducing the area of the pixel-driving circuit CA. The capacitor Cst occupies the largest area among the elements of the pixel-driving circuit and thus is one of the elements that significantly lowers the aperture ratio.

By integrating the capacitor Cst into the LED, the area of the pixel-driving circuit CA can be reduced, and accordingly, the area of the display area DA occupied by the pixel-driving circuit is reduced while the transmission area TA is increased, so that the aperture ratio is increased.

In terms of transmittance, the LED display device has a higher transmittance than the OLED display device because a color filter that is an element of the OLED display device and a cathode electrode stacked on the front surface are not formed.

In addition, according to the exemplary embodiment of the present disclosure, the LED display device can solve the issues of low transmittance and installation of a backlight unit that occur when the liquid-crystal display device is implemented as a transparent display device.

FIG. 2 is a cross-sectional view showing a capacitor-integrated LED (capacitor LED) according to a first exemplary embodiment of the present disclosure. The capacitor-integrated LED (capacitor LED) of FIG. 2 includes an n-type electrode 110, an n-type layer 120, an active layer 130, a p-type layer 140, a second capacitor electrode 150, a capacitor dielectric layer 160, and a first capacitor electrode 170.

Among these, except for the first capacitor electrode 170 and the capacitor dielectric layer 160, the structure in which the n-type electrode 110, the n-type layer 120, the active layer 130, the p-type layer 140 and the second capacitor electrode 150 are sequentially stacked on one another shows the structure of a vertical type LED.

While the second capacitor electrode 150, the capacitor dielectric layer 160 and the first capacitor electrode 170 are the elements of the capacitor Cst typically included in the pixel-driving circuit and disposed on the substrate in a display device, according to the exemplary embodiment of the present disclosure, the capacitor Cst including the first capacitor electrode 150, the capacitor dielectric layer 160 and the second capacitor electrode 170 is located inside the LED to form the capacitor-integrated LED.

Hereinafter, features of each of the elements of the capacitor-integrated LED (capacitor LED) will be described with reference to FIG. 2.

Among the elements of the capacitor-integrated LED, the n-type electrode 110 located on the top is connected to a first voltage source through a first voltage line Vcom to apply a first supply voltage Vcom. The first voltage line Vcom is commonly connected to each of the capacitor-integrated LEDs, and provides a negative load to the n-type electrode 110.

The n-type layer 120 located under the n-type electrode 110 is a semiconductor layer that receives electrons from the n-type electrode 110 and generates electric current by moving free electrons having negative charges as carriers. It can be made of a GaN-based material. The n-GaN-based material can be GaN, AlGaN, InGaN, AlInGaN, etc. and Si, Ge, Se, Te, and C can be used as impurities used for doping the n-type layer 120.

In addition, the n-type layer 120 can be aluminum-doped indium phosphide (AlInP). For example, in order for the capacitor-integrated LED to emit red light, the n-type layer 120 can be formed of aluminum-doped indium phosphide (n-AlInP).

The active layer 130 is disposed under the n-type layer 120. The active layer 130 can have a multi-quantum well (MQW) structure having a well layer and a barrier layer having a higher bandgap than that of the well layer. For example, the active layer 130 can have a multiple quantum well structure such as AlGaInP, GaInP, InGaN and GaN.

The p-type layer 140 is disposed under the active layer 130. The p-type layer 140 is a semiconductor layer that receives holes from the second capacitor electrode 150 and generates electric current by moving the holes having positive charges as carriers, and can be made of a p-GaN-based material. The p-GaN-based material can be GaN, AlGaN, InGaN, AlInGaN, etc., and Mg, Zn, Be, etc. can be used as impurities used for doping the p-type semiconductor layer.

The second capacitor electrode 150 is disposed under the p-type layer 140. The second capacitor electrode 150 is connected to a driving thin-film transistor 300 of the pixel-driving circuit CA to be described later, and receives a second supply voltage Vdd through a second voltage line (Vdd line) connected to the driving thin-film transistor. The second voltage line (Vdd line) provides a positive load to the second capacitor electrode 150.

In addition, the capacitor dielectric layer 160 and the first capacitor electrode 170 are disposed under the second capacitor electrode 150. The capacitor Cst is formed in the region where the second capacitor electrode 150 and the first capacitor electrode 170 overlap each other, and stores data voltage Vdata received from a switching thin-film transistor 400 of the pixel-driving circuit CA to be described later. The data voltage Vdata stored in the capacitor Cst allows the driving thin-film transistor 300 to provide the same driving current to the capacitor-integrated LED for a single frame.

Accordingly, the second capacitor electrode 150 according to the first exemplary embodiment can function not only as one electrode of the capacitor that stores the data voltage Vdata but also as the p-type electrode that applies the stored data voltage Vdata to the p-type layer 140.

Each of the first capacitor electrode 170 or the second capacitor electrode 150 can be formed as a reflective electrode that includes at least one of gold (Au), aluminum (AL), silver (Ag), nickel (Ni) and chromium (Cr) materials. By forming the capacitor electrodes as the reflective electrodes, light emitted from the active layer is reflected off the capacitor electrodes, thereby increasing the out-coupling efficiency. In addition, when the n-type electrode 110 is made of a translucent material, the first or second capacitor electrode, which is a reflective electrode and the n-type electrode form a resonance structure, thereby further enhancing the out-coupling efficiency.

Figure 3:
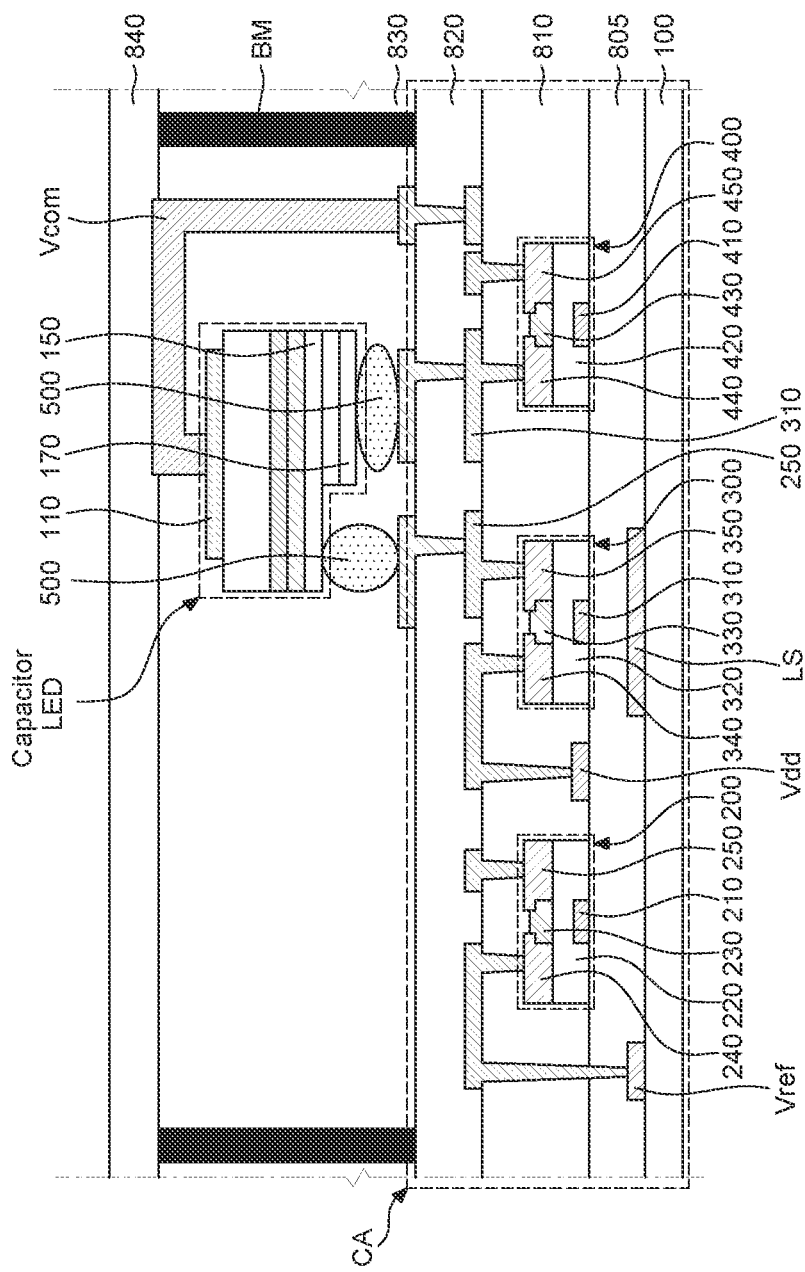
FIG. 3 is a cross-sectional view showing a pixel-driving circuit of the capacitor-integrated LED shown in FIG. 2.

The capacitor-integrated LED (capacitor LED) can be electrically connected to the driving thin-film transistor 300 and the switching thin-film transistor 400 through bump balls 500. Referring to FIG. 3, the first capacitor electrode 170 of the capacitor-integrated LED is connected to a drain electrode 440 of the switching thin-film transistor 400 through a bump ball 500, and the second capacitor electrode 150 is electrically connected to a source electrode 350 of the driving thin-film transistor 300 through the ball 500.

Hereinafter, the connection structure through the bump balls 500 will be described in detail. The capacitor Cst according to the exemplary embodiment has a mesa shape including a flat top and steep sides, so that the height of the first capacitor electrode 170 is different from the height of the second capacitor electrode 150. Accordingly, the gap between the first capacitor electrode 170 and the pixel-driving circuit is larger than the gap between the second capacitor electrode 150 and the pixel-driving circuit. In order to compensate for the gap difference, bump balls which have a high elastic strain and are composed of a polymer core and a metal layer surrounding the polymer core are used, so that the first and second capacitor electrodes can be electrically connected to the pixel-driving circuit. The connection structure using the bump balls is merely illustrative. The capacitor electrodes and the pixel-driving circuit can be connected by solder bumps and solder paste, by an anisotropic conductive film (ACF), etc.

FIG. 3 is a cross-sectional view for illustrating the pixel-driving circuit of the red capacitor-integrated LED (R capacitor LED or R_capacitor LED) of FIG. 2 as an example. The pixel-driving circuit according to the first exemplary embodiment of FIG. 3 includes the switching thin-film transistor 400, the driving thin-film transistor 300 and the sensing thin-film transistor 200. Each of the thin-film transistors includes a gate electrode, a source electrode, an active layer, and a drain electrode, and can be implemented as a top-gate or coplanar transistor in which the gate electrode is disposed above the active layer, or as a bottom-gate transistor in which the gate electrode is disposed below the active layer, depending on the purpose of use. The driving thin-film transistor 300 and the sensing thin-film transistor 200 can be implemented as NMOS thin-film transistors, while the switching thin-film transistor 400 can be implemented as a PMOS thin-film transistor. It is, however, to be noted that the technical idea of the present disclosure is not limited thereto. For example, the switching thin-film transistor 400 can be implemented as an NMOS thin-film transistor having good off-current characteristics, while the driving and sensing thin-film transistors 300 and 200 can be implemented as PMOS thin-film transistors having good response characteristics.

Figure 4:
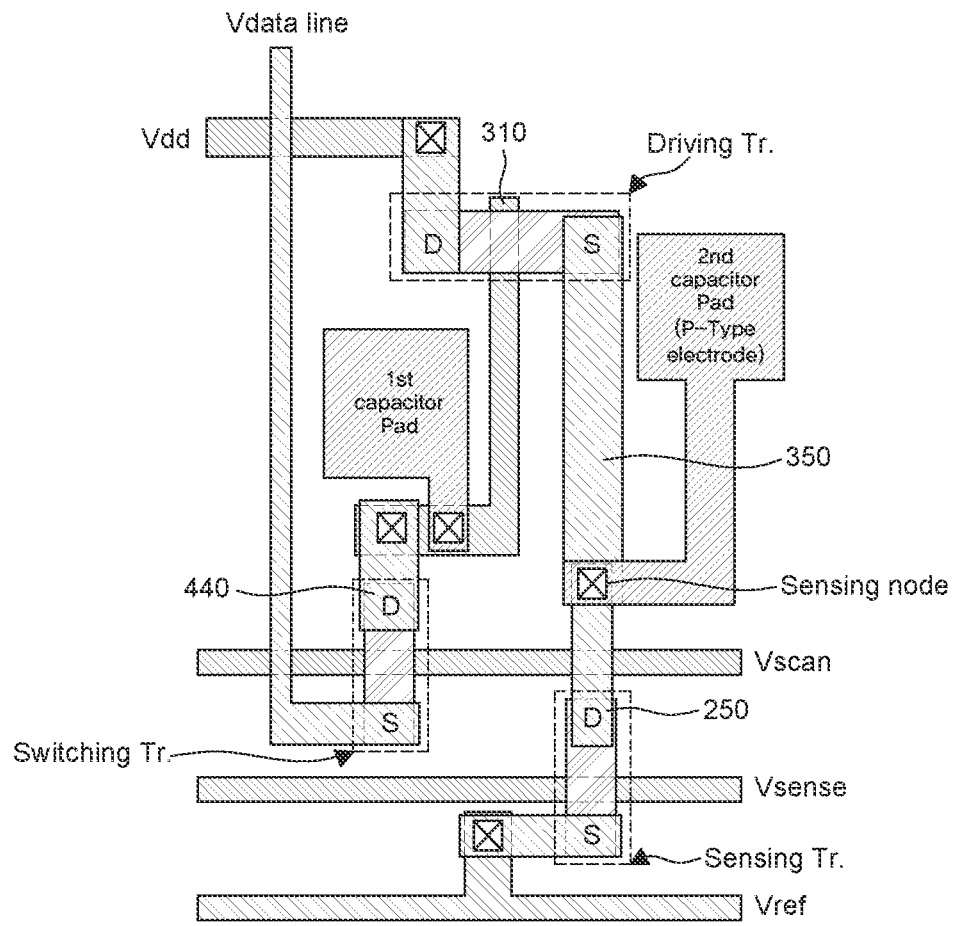
FIG. 4 is a plan view showing a connection structure of the pixel-driving circuit shown in FIG. 3.

FIG. 4 is a plan view of a pixel-driving circuit of the display device shown in FIG. 3, showing an example of the connection relationship between thin-film transistors. It is, however, to be understood that the connection structure of the present disclosure is not limited thereto.

Hereinafter, characteristics of each of the thin-film transistors and the operation of the pixel-driving circuit according to the first exemplary embodiment will be described with reference to FIGS. 3 and 4.

The switching thin-film transistor 400 has a gate electrode 410 connected to a scan line Vscan, a drain electrode 450 connected to a data voltage line (Vdata line), and a source electrode 440 connected to the capacitor Cst and the gate electrode 310 of the driving thin-film transistor. The switching thin-film transistor 400 performs switching operation in response to a scan signal Vscan supplied through the scan line so that data signal Vdata supplied through the data voltage line (Vdata line) is stored in the capacitor Cst as data voltage and a signal is supplied to the gate electrode 310 of the driving thin-film transistor.

The driving thin-film transistor 300 has the gate electrode 310 connected to the source electrode 440 of the switching thin-film transistor, a drain electrode 340 connected to the second voltage line (Vdd line), and a source electrode 340 connected to the second capacitor electrode 150 and a source electrode 250 of the sensing thin-film transistor. The driving thin-film transistor 300 performs switching operation in response to a drain electrode signal of the switching thin-film transistor so that the second supply voltage Vdd supplied through the second voltage line (Vdd line) flows according to the data voltage stored in the capacitor Cst. The second supply voltage Vdd adjusted by the capacitor Cst is applied to the second capacitor electrode 150 functioning as the p-type electrode.

The sensing thin-film transistor 200 has a gate electrode 210 connected to a sensing line Vsense, a drain electrode 240 connected to a sensing voltage line Vref, and the source electrode 250 connected to a connection line between the source electrode 350 of the driving thin-film transistor and the second capacitor electrode 150. The sensing thin-film transistor 200 performs switching operation in response to a signal from the sensing line Vsense so that a sensing voltage (or initializing voltage) transmitted through the sensing voltage line Vref is supplied to a sensing node or voltage or electric current at the sensing node is sensed.

In addition, the first voltage line Vcom is connected to the n-type electrode 110 of the capacitor-integrated LED and supplies the first supply voltage Vcom to the n-type electrode 110. The first voltage line is commonly connected to adjacent red, green and blue capacitor integrated LEDs (R capacitor LED (also referred to as R_capacitor LED), G capacitor LED (also referred to as G_capacitor LED), B capacitor LED (also referred to as B_capacitor LED) to apply the same voltage.

Accordingly, the first supply voltage Vcom is applied to the n-type electrode 110 to supply electrons to the n-type layer 120, while the second supply voltage Vdd is applied to the second capacitor electrode 150 to supply holes to the p-type layer 140, so that electrons and holes are combined in the active layer 130 between the n-type layer 120 and the p-type layer 140 to emit light.

The brightness of the light can be adjusted according to the voltage difference between the first supply voltage Vcom and the second supply voltage Vdd. In order to adjust the brightness of the light, the first supply voltage Vcom having a fixed value is applied as a common voltage, and the second supply voltage Vdd is adjusted and supplied through the switching thin-film transistor 400 and the driving thin-film transistor 300.

Figure 5:
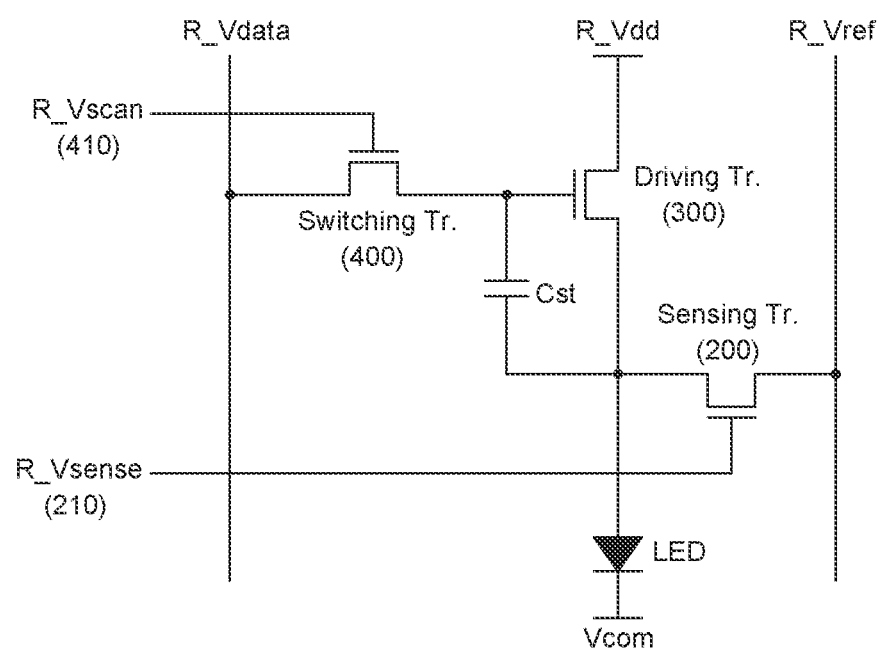
FIG. 5 is a circuit diagram showing a connection structure of the pixel-driving circuit shown in FIG. 3.

FIG. 5 is a circuit diagram showing connection structure between the capacitor-integrated LED and the pixel-driving circuit shown in FIG. 3. Although FIG. 5 shows a SUB-pixel having a 3T (transistor) 1C (capacitor) structure composed of a switching thin-film transistor 400, a driving thin-film transistor 300, a sensing thin-film transistor 200, and a capacitor-integrated LED, the present disclosure is not limited thereto. Each sub-pixel can have 2T1C, 3T2C, 4T2C, 5T1C, or 6T2C structure.

An object of the present disclosure is to reduce the area of the pixel-driving circuit while increasing the transmission area. As the number of transistors and capacitors decreases, the area of the pixel-driving circuit decreases. Therefore, only the structures of 3T1C and 2T1C in which the number of thin-film transistors and capacitors are relatively small will be described herein.

Figure 6:
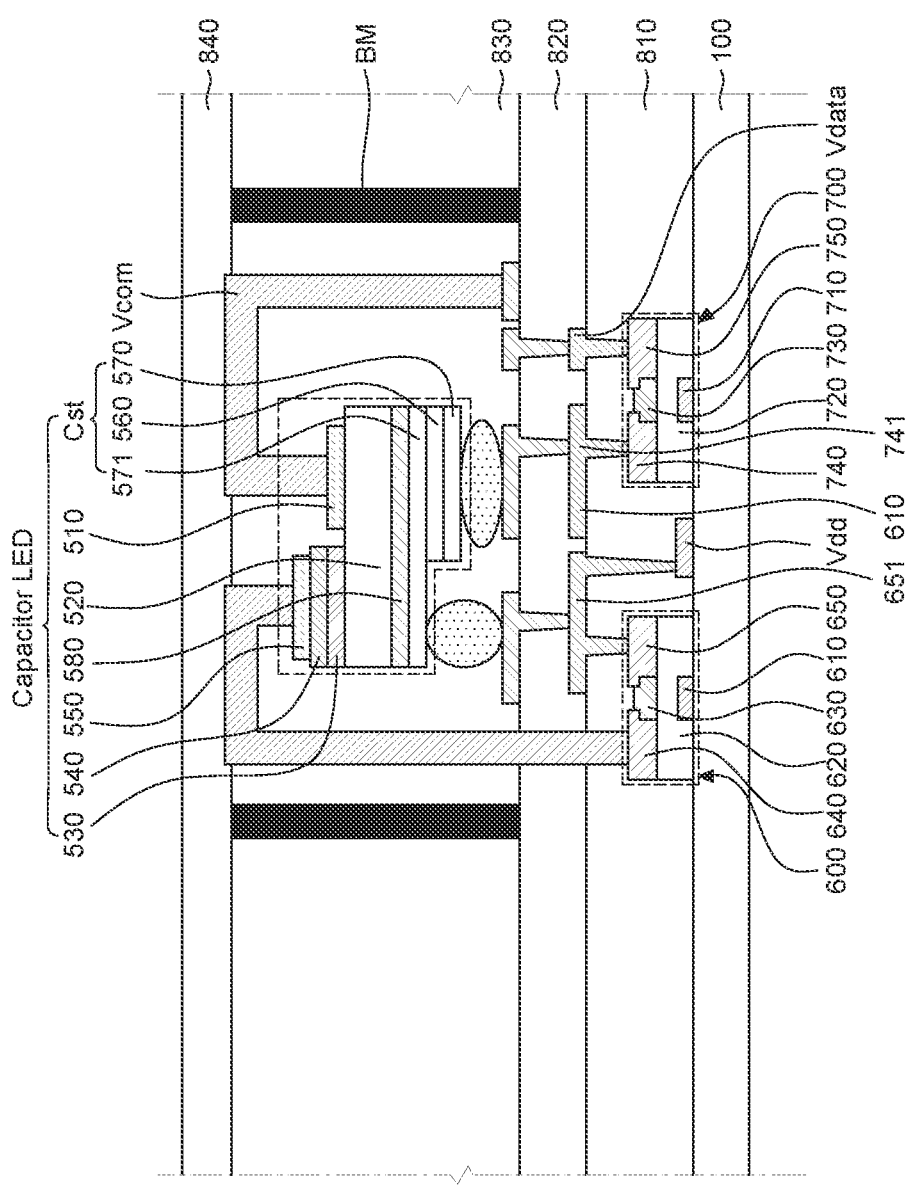
FIG. 6 is a cross-sectional view showing a connection structure of a capacitor-integrated LED and a pixel-driving circuit of the display device shown in FIG. 1 according to a second exemplary embodiment of the present disclosure.

FIG. 6 is a cross-sectional view showing connection relationship between the capacitor-integrated LED and the pixel-driving circuit shown in FIG. 1 according to a second exemplary embodiment having a 2T1C structure.

The capacitor-integrated LED (capacitor LED) of FIG. 6 includes an n-type electrode 510, an n-type layer 520, an active layer 530, a p-type layer 540, a p-type electrode 550, a second capacitor electrode 571, a capacitor dielectric layer 560, and a first capacitor electrode 570.

Among these, the n-type electrode 510 and the active layer 530 are located on the same layer above the n-type layer 520, and the p-type layer 540 and the p-type electrode 550 are sequentially located on the active layer 530. That is to say, capacitor-integrated LED (capacitor LED) is of a lateral type LED.

In addition, the second capacitor electrode 571, the capacitor dielectric layer 560 and the first capacitor electrode 570 are disposed under the n-type layer 520, to implement the capacitor-integrated LED.

Hereinafter, characteristics of each of the elements of the capacitor-integrated LED according to the second exemplary embodiment will be described.

The p-type electrode 550 located on the top of the capacitor-integrated LED is connected to the drain electrode 640 of the driving thin-film transistor 600 among the elements of the pixel-driving circuit CA, and receives the second voltage Vdd according to the data voltage Vdata stored in the capacitor Cst. The second voltage Vdd provides a positive load to the P-type electrode 550.

The p-type layer 540 disposed under the p-type electrode 550 is a semiconductor layer that receives holes from the p-type electrode and generates electric current by moving the holes having positive charges as carriers, and can be made of a p-GaN-based material. The p-GaN-based material can be GaN, AlGaN, InGaN, AlInGaN, etc., and Mg, Zn, Be, etc. can be used as impurities used for doping the p-type semiconductor layer.

The active layer 530 is disposed under the p-type layer 540. The active layer 530 is disposed on the n-type layer 520 and can have a multi-quantum well (MQW) structure having a well layer and a barrier layer having a higher bandgap than that of the well layer. For example, the active layer 530 can have a multiple quantum well structure such as AlGaInP, GaInP, InGaN and GaN.

The n-type layer 520 located under the active layer 530 is a semiconductor layer that receives electrons from the n-type electrode 510 and generates electric current by moving free electrons having negative charges as carriers. It can be made of a GaN-based material. The n-GaN-based material can be GaN, AlGaN, InGaN, AlInGaN, etc. and Si, Ge, Se, Te, and C can be used as impurities used for doping the n-type layer 520.

In addition, the n-type layer 520 can be aluminum-doped indium phosphide (AlInP). For example, in order for the capacitor-integrated LED to emit red light, the n-type layer 520 can be formed of aluminum-doped indium phosphide (n-AlInP).

The n-type electrode 510 located on the n-type layer is connected to the first voltage line (Vcom line) used as a common voltage Vcom, and receives the first supply voltage Vcom. The first supply voltage line (Vcom line) is commonly connected to each of the capacitor-integrated LEDs to apply a constant voltage. The first voltage line (Vcom line) provides a negative load to the n-type electrode 510.

The second capacitor electrode 571 is disposed under the n-type layer, and the capacitor dielectric layer 560 and the first capacitor electrode 570 are disposed under the second capacitor electrode. The capacitor Cst is formed in the region where the second capacitor electrode 571 and the first capacitor electrode 570 overlap each other, and stores data voltage Vdata received from a switching thin-film transistor 700 of the pixel-driving circuit CA to be described later. The data voltage Vdata stored in the capacitor Cst allows the driving thin-film transistor 600 to provide the same driving current to the capacitor-integrated LED for a single frame.

Each of the first capacitor electrode 570 or the second capacitor electrode 571 can be formed as a reflective electrode that includes at least one of gold (Au), aluminum (AL), silver (Ag), nickel (Ni) and chromium (Cr) materials. By forming the capacitor electrodes as the reflective electrodes, light emitted from the active layer is reflected off the capacitor electrodes, thereby increasing the out-coupling efficiency.

The capacitor-integrated LED according to the second exemplary embodiment can be electrically connected to the driving thin-film transistor 600 and the switching thin-film transistor 700 through bump balls 500. Specifically, the first capacitor electrode 570 of the capacitor-integrated LED is connected to a drain electrode 740 of the switching thin-film transistor 700 through a bump ball 500, and the second capacitor electrode 571 is electrically connected to a source electrode 650 of the driving thin-film transistor 600 through the ball 500. The capacitor Cst of the capacitor-integrated LED has a mesa shape like the configuration of the first exemplary embodiment, and features that it is connected to the pixel-driving circuit CA through the bump balls 500.

Referring to FIG. 6, the pixel-driving circuit according to the second exemplary embodiment has a 2T1C structure including the switching thin-film transistor 700 and the driving thin-film transistor 600, and the capacitor is integrally formed with the LED. Each of the thin-film transistors includes a gate electrode, a source electrode, an active layer, and a drain electrode, and can be implemented as a top-gate or coplanar transistor in which the gate electrode is disposed above the active layer, or as a bottom-gate transistor in which the gate electrode is disposed below the active layer, depending on the purpose of use. The driving thin-film transistor 600 can be implemented as a PMOS thin-film transistor, while the switching thin-film transistor 700 can be implemented as a NMOS thin-film transistor. It is, however, to be noted that the technical idea of the present disclosure is not limited thereto. For example, the switching transistor 700 can be implemented as a PMOS thin-film transistor having good response characteristics, while the driving thin-film transistor 600 can be implemented as a NMOS thin-film transistor having good off-current characteristics.

Hereinafter, the characteristics of each of the thin-film transistors and the operation of the pixel-driving circuit according to the second exemplary embodiment will be described.

The switching thin-film transistor 700 has a gate electrode 710 connected to a scan line Vscan, a source electrode 750 connected to a data voltage line (Vdata line), and a drain electrode 740 connected to a first capacitor electrode 570 and a gate electrode 610 of the driving thin-film transistor. The switching thin-film transistor 700 performs switching operation in response to a scan signal Vscan supplied through the scan line so that data signal Vdata supplied through the data voltage line (Vdata line) is stored in a storage capacitor Cst as data voltage and a signal is supplied to the gate electrode 610 of the driving thin-film transistor.

The driving thin-film transistor 600 has the gate electrode 610 connected to the drain electrode 740 of the switching thin-film transistor, and the source electrode 650 connected to the second voltage line (Vdd line) and the second capacitor electrode 571. The drain electrode 640 is connected to the p-type electrode 550. The driving thin-film transistor 600 performs switching operation in response to a source electrode signal of the switching thin-film transistor so that the second supply voltage Vdd supplied through the second voltage line (Vdd line) is applied to the second capacitor electrode 571 to form the capacitor with the first capacitor electrode 570 and the second supply voltage Vdd flows according to the data voltage stored in the capacitor Cst. The second supply voltage Vdd adjusted according to the data voltage Vdata is supplied to the p-type electrode 550 through the drain electrode 640.

In addition, the first voltage line Vcom is connected to the n-type electrode 510 of the capacitor-integrated LED and supplies the first supply voltage Vcom to the n-type electrode 510. The first voltage line is commonly connected to adjacent red, green and blue capacitor integrated LEDs (R, G, B_capacitor LEDs) to apply the same voltage.

Accordingly, the first supply voltage Vcom is applied to the n-type electrode 510 to supply electrons to the n-type layer 520, and the second supply voltage Vdd is applied to the p-type electrode 550 to supply holes to the p-type layer 540, so that electrons and holes are combined in the active layer 530 located between the n-type layer 520 and the p-type layer 540 to emit light.

The brightness of the light can be adjusted according to the voltage difference between the first supply voltage Vcom and the second supply voltage Vdd. In order to adjust the brightness of the light, the first supply voltage Vcom having a fixed value is applied as a common voltage, and the second supply voltage Vdd is adjusted and supplied through the switching thin-film transistor 700 and the driving thin-film transistor 600.

Figure 7:
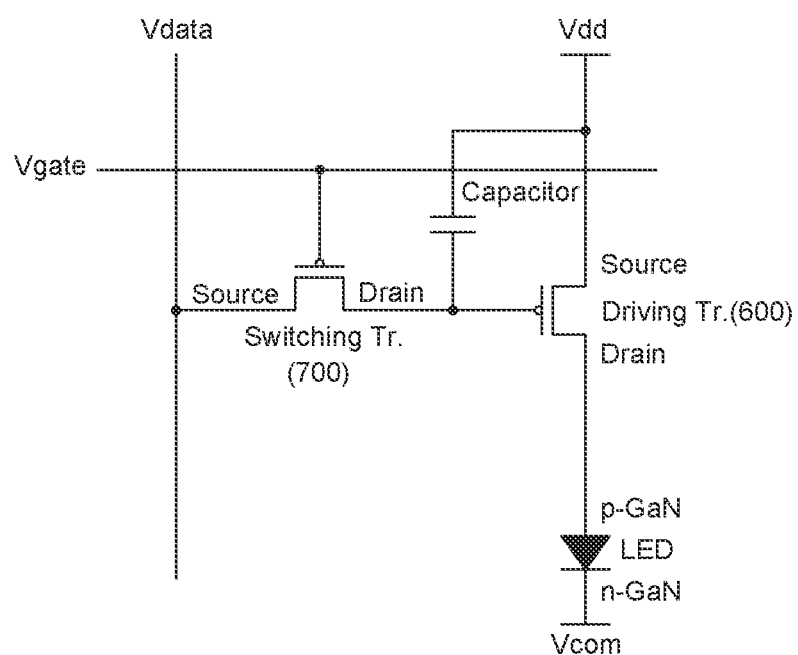
FIG. 7 is a circuit diagram showing a connection structure of the pixel-driving circuit shown in FIG. 6.

FIG. 7 is a circuit diagram showing connection structure between the capacitor-integrated LED and the pixel-driving circuit shown in FIG. 6. Although FIG. 7 shows that the switching thin-film transistor 700, the driving thin-film transistor 600 and the capacitor-integrated LED forms a sub-pixel having a 2T1C structure, the present disclosure is not limited thereto.

Hereinafter, the overall structure of the display device according to an exemplary embodiment of the present disclosure in which the pixel-driving circuit CA and the capacitor LED are connected, and a method of fabricating the same will be described with reference to FIGS. 2 and 3.

A method of fabricating an LED display device according to an exemplary embodiment of the present disclosure includes forming a light-shielding layer LS in a region where a driving thin-film transistor 300 is located on a substrate 100, and forming a buffer layer 805 over the light-shielding layer. After forming the buffer layer, a switching thin-film transistor, a driving thin-film transistor and a sensing thin-film transistor each including a gate electrode, an active layer, a source electrode and a drain electrode are formed on the buffer layer.

After forming the thin-film transistors, for connection with a capacitor-integrated LED (capacitor LED), the space between the thin-film transistors is applied with a first insulating material 810, and a second insulating material 820 is applied on the thin-film transistors. After applying the second insulating material, contact holes exposing the source electrode or the drain electrode of the thin-film transistors are formed, and connection lines connecting the exposed source electrode or the drain electrode are formed.

After forming the connection lines, capacitor-integrated LEDs are connected to the connection lines, and the space between and above the capacitor-integrated LEDs are coated with a third insulating material 830. After applying the third insulating material, a contact hole exposing the n-type electrode 110 is formed, and the n-type electrode is connected to a first voltage line (Vcom line).

Before applying the third insulating material, a black matrix BM can be formed between the capacitor-integrated LEDs (capacitor LEDs). The black matrix BM can be formed after applying the third insulating material by forming a black matrix hole and then filling the hole. The black matrix BM is an element capable of reducing the color mixture of light by blocking the light directed to other capacitor-integrated LEDs among the light emitted from each of the capacitor-integrated LEDs.

The capacitor-integrated LED according to the exemplary embodiment of the present disclosure can be applied to a micro LED or a mini LED. A micro LED and a mini LED can be distinguished from each other according to their size and whether a sapphire substrate used as a growth substrate is removed or not. Specifically, an LED having a size less than 100 μm and in which the growth substrate is removed is sorted into a micro LED. An LED having a size more than 100 μm and less than 500 μm and in which the growth substrate is not removed is sorted into a mini LED.

Red, green and blue micro LEDs or mini LEDs are surrounded by a molding and can be configured as a package LED of a single set, and a capacitor-integrated LED can also be applied to red, green and blue micro LEDs or mini LEDs forming the package LED.

It is to be noted that typical LEDs commercially used for a luminaire have a size of 500 μm or more, and has a structure in which a fluorescent material is applied to an LED chip, with a lens placed at the top.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present invention is defined by the appended claims and all equivalents thereof are construed to be within the true scope of the present disclosure.

What is claimed is:

1. A light emitting diode (LED) display device comprising:
   a pixel-driving circuit on a substrate;
   a capacitor-integrated LED connected to the pixel-driving circuit; and
   a black matrix between the capacitor-integrated LED and an adjacent capacitor-integrated LED,
   wherein the capacitor-integrated LED has an active layer and a capacitor disposed under the active layer,
   wherein the capacitor is overlapped with the active layer,
   wherein the capacitor is configured as a storage capacitor for storing a data voltage,
   wherein the capacitor of the capacitor-integrated LED comprises a first capacitor electrode, a second capacitor electrode, and a capacitor dielectric layer between the first capacitor electrode and the second capacitor electrode,
   wherein the second capacitor electrode is closer to the active layer than the first capacitor electrode,
   wherein the pixel-driving circuit comprises:
      a switching thin-film transistor or a driving thin-film transistor connected to the first capacitor electrode, and
      a switching thin-film transistor or a driving thin-film transistor connected to the second capacitor electrode, and
   wherein the LED display device further comprises:
      a first insulating layer between the switching thin-film transistor and the driving thin-film transistor;
      a second insulating layer between the pixel-driving circuit and the capacitor-integrated LED; and
      a third insulating layer between the capacitor-integrated LED and an adjacent capacitor-integrated LED.

2. The LED display device of claim 1, wherein the substrate comprises a transmission area and a display area, and
   wherein the pixel-driving circuit and the capacitor-integrated LED are located in the display area.

3. The LED display device of claim 2, wherein the LED display device comprising the substrate, the pixel-driving circuit and the capacitor-integrated LED has a transmittance of approximately 60% or more and an aperture ratio of approximately 63% or more.

4. The LED display device of claim 1, wherein the first capacitor electrode or the second capacitor electrode is a reflective electrode comprising at least one of gold (Au), aluminum (AL), silver (Ag), nickel (Ni) or chromium (Cr) materials.

5. The LED display device of claim 1, wherein a p-type layer, the active layer, an n-type layer and an n-type electrode are sequentially stacked on the second capacitor electrode.

6. The LED display device of claim 5, wherein the second capacitor electrode functions as a p-type electrode connected to the p-type layer to apply a voltage and also as one electrode of the capacitor.

7. The LED display device of claim 5, further comprising: a first voltage line connected to the n-type electrode.

8. The LED display device of claim 1, wherein an n-type layer is disposed on the second capacitor electrode,
   wherein an n-type electrode and the active layer are located on a same layer above the n-type layer, and
   wherein a p-type layer and a p-type electrode sequentially stacked on the active layer.

9. The LED display device of claim 8, further comprising: a first voltage line connected to the n-type electrode.

10. The LED display device of claim 1, wherein the pixel-driving circuit further comprises a sensing thin-film transistor,
   wherein the switching thin-film transistor comprises a gate electrode connected to a first gate line, a drain electrode connected to a data voltage line, and a source electrode connected to a gate electrode of the driving thin-film transistor and the first capacitor electrode,
   wherein the driving thin-film transistor comprises a gate electrode connected to a source electrode of the switching thin-film transistor, a drain electrode connected to a second voltage line, and a source electrode connected to the second capacitor electrode, and wherein the sensing thin-film transistor comprises a gate electrode connected to a second gate line, a drain electrode connected to a sensing voltage line, and a source electrode connected to the source electrode of the driving thin-film transistor.

11. The LED display device of claim 10, wherein the capacitor has a mesa shape including a flat top and steep sides, so that a height of the first capacitor electrode is different from a height of the second capacitor electrode, wherein the first capacitor electrode and the second capacitor electrode are electrically connected to the source electrode of the switching thin-film transistor and the source electrode of the driving thin-film transistor through conductors, respectively, and wherein the conductors comprise bump balls composed of an inner polymer core and an outer metal layer.

12. The LED display device of claim 1, wherein the switching thin-film transistor comprises a gate electrode connected to a first gate line, a source electrode connected to a data voltage line, and a drain electrode connected to a gate electrode of the driving thin-film transistor and the first capacitor electrode, and wherein the driving thin-film transistor comprises a gate electrode connected to the drain electrode of the switching thin-film transistor, a source electrode connected to a second supply voltage and the second capacitor electrode, and a drain electrode connected to the p-type electrode.

13. The LED display device of claim 1, wherein the first capacitor electrode and the second capacitor electrode are electrically connected to the drain electrode of the switching thin-film transistor and the source electrode of the driving thin-film transistor through conductors, respectively, and wherein the conductors comprise bump balls composed of an inner polymer core and an outer metal layer.

14. The LED display device of claim 1, wherein the capacitor-integrated LED is a micro LED or a mini LED.

15. The LED display device of claim 14, wherein the capacitor-integrated LED is a vertical type LED or a lateral type LED.

* * * * *